(12) United States Patent
Ren et al.

(10) Patent No.: US 11,923,244 B2
(45) Date of Patent: Mar. 5, 2024

(54) SUBTRACTIVE METALS AND SUBTRACTIVE METAL SEMICONDUCTOR STRUCTURES

(71) Applicant: Applied Materials, Inc., Santa Clara, CA (US)

(72) Inventors: He Ren, San Jose, CA (US); Hao Jiang, San Jose, CA (US); Shi You, San Jose, CA (US); Mehul B. Naik, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/193,994

(22) Filed: Mar. 5, 2021

(65) Prior Publication Data
US 2022/0285212 A1 Sep. 8, 2022

(51) Int. Cl.
*H01L 21/768* (2006.01)

(52) U.S. Cl.
CPC .. *H01L 21/76843* (2013.01); *H01L 21/76879* (2013.01)

(58) Field of Classification Search
CPC ......... H01L 21/76843; H01L 21/76879; H01L 21/67184; H01L 21/76849; H01L 21/76885; H01L 21/76897; H01L 21/76876; C23C 14/022; C23C 14/024; C23C 14/046; C23C 14/165; C23C 14/345; C23C 16/45523
See application file for complete search history.

(56) References Cited

U.S. PATENT DOCUMENTS

| 8,017,523 B1 | 9/2011 | Wu et al. | |
|---|---|---|---|
| 2002/0058408 A1* | 5/2002 | Maydan | H01L 21/76885 257/E21.582 |
| 2005/0181598 A1 | 8/2005 | Kailasam | |
| 2006/0258152 A1* | 11/2006 | Haider | H01L 21/76843 438/644 |

(Continued)

FOREIGN PATENT DOCUMENTS

WO 2008036115 A1 3/2008

OTHER PUBLICATIONS

International Search Report and Written Opinion dated Apr. 26, 2022 for Application No. PCT/US2022/011342.

(Continued)

*Primary Examiner* — Julia Slutsker
(74) *Attorney, Agent, or Firm* — Patterson + Sheridan, LLP (57) ABSTRACT

Embodiments of the present disclosure generally relate to subtractive metals, subtractive metal semiconductor structures, subtractive metal interconnects, and to processes for forming such semiconductor structures and interconnects. In an embodiment, a process for fabricating a semiconductor structure is provided. The process includes performing a degas operation on the semiconductor structure and depositing a liner layer on the semiconductor structure. The process further includes performing a sputter operation on the semiconductor structure, and depositing, by physical vapor deposition, a metal layer on the liner layer, wherein the liner layer comprises Ti, Ta, TaN, or combinations thereof, and a resistivity of the metal layer is about 30 µΩ·cm or less.

20 Claims, 7 Drawing Sheets

(56) References Cited

U.S. PATENT DOCUMENTS

| | | | |
|---|---|---|---|
| 2009/0212434 A1* | 8/2009 | Anderson | H01L 21/2855 438/653 |
| 2016/0240483 A1* | 8/2016 | Cheng | C23C 14/0676 |
| 2020/0258777 A1* | 8/2020 | Wu | H01L 21/823431 |

OTHER PUBLICATIONS

Taiwan Office Action dated Dec. 28, 2023 for Application No. 111107715.

* cited by examiner

SUBTRACTIVE METALS AND SUBTRACTIVE METAL SEMICONDUCTOR STRUCTURES

BACKGROUND

Field

Embodiments of the present disclosure generally relate to subtractive metals, subtractive metal semiconductor structures, subtractive metal interconnects, and to processes for forming such semiconductor structures and interconnects.

Description of the Related Art

Interconnects are structures that connect circuit elements electrically. Conventionally, on-chip interconnects are fabricated by damascene processes in which apertures are created through various layers of the device structure, and the apertures are filled with a conductive material, such as copper, to form the interconnects between layers and between device features located on individual layers. Copper damascene processes, however, can be impractical for chips having feature sizes below 50 nm. For example, metal resistivity increases with narrow linewidths due to grain boundary scattering and there is an increased risk of electromigration in Cu interconnects in narrow lines. To overcome this challenge, subtractive metals including tungsten (W) and other metal interconnects have been proposed. Fabricating such interconnects typically includes depositing a W layer on a metal etch stop/liner layer (e.g., TiN) followed by subtractively etching the W layer and TiN layer and filling the newly formed metal trench with dielectric material. However, W and other metals deposited on TiN suffer from high resistivity, e.g., 40 µΩ·cm or more.

There is a need for improved subtractive metal semiconductor structures, subtractive metal interconnects, and processes for forming the same.

SUMMARY

Embodiments of the present disclosure generally relate to subtractive metals, subtractive metal semiconductor structures, subtractive metal interconnects, and to processes for forming such semiconductor structures and interconnects.

In an embodiment, a process for fabricating a semiconductor structure is provided. The process includes performing a degas operation on the semiconductor structure and depositing a liner layer on the semiconductor structure. The process further includes performing a sputter operation on the semiconductor structure, and depositing, by physical vapor deposition, a metal layer on the liner layer, wherein the liner layer comprises Ti, Ta, TaN, or combinations thereof, and a resistivity of the metal layer is about 30 µΩ·cm or less.

In another embodiment, a process for fabricating a semiconductor structure is provided. The process includes performing a degas operation on the semiconductor structure and depositing, by physical vapor deposition, an etch stop layer on the semiconductor structure after the degas operation. The process further includes performing a sputter operation on the semiconductor structure, and depositing, by physical vapor deposition, a metal layer on the semiconductor structure after performing the sputter operation.

In another embodiment, a process for fabricating an interconnect structure is provided. The process includes performing a degas operation on the semiconductor structure, the semiconductor structure comprising a dielectric material and a via hole, the via hole at least partially filled with a metal material. The process further includes depositing, by chemical vapor deposition, an etch stop layer on the semiconductor structure after the degas operation. The process further includes depositing, by physical vapor deposition, a metal layer on the semiconductor structure after depositing the etch stop layer to form the interconnect structure.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to subtractive metals, subtractive metal semiconductor structures, subtractive metal interconnects, and to processes for forming such semiconductor structures and interconnects. The inventors have found new and improved etch stop/liner materials that can, e.g., actively lead to low-resistivity metal layers formed thereon. The inventors have also found new and improved processes that can change one or more properties of conventional etch stop/liner materials (e.g., TiN) such that metal layers formed thereon have low resistivity. The inventors have also found new and improved processes that enable selective deposition of etch stop liner materials such that the metal layers formed thereon have low resistivity.

Line resistance and via resistance are important characteristics for interconnects. As described above, conventional materials for forming interconnects for small feature sizes using subtractive processes exhibit resistivities that are too high. In addition, metal etch stop/liner materials useful in such subtractive processes should ensure adhesion between dielectric materials and metal materials of semiconductor structures to avoid delamination, and should sufficiently prevent etching from reaching underlying vias and/or other features of semiconductor structures. Embodiments described herein enable materials meeting these and other requirements.

Figure 1A:
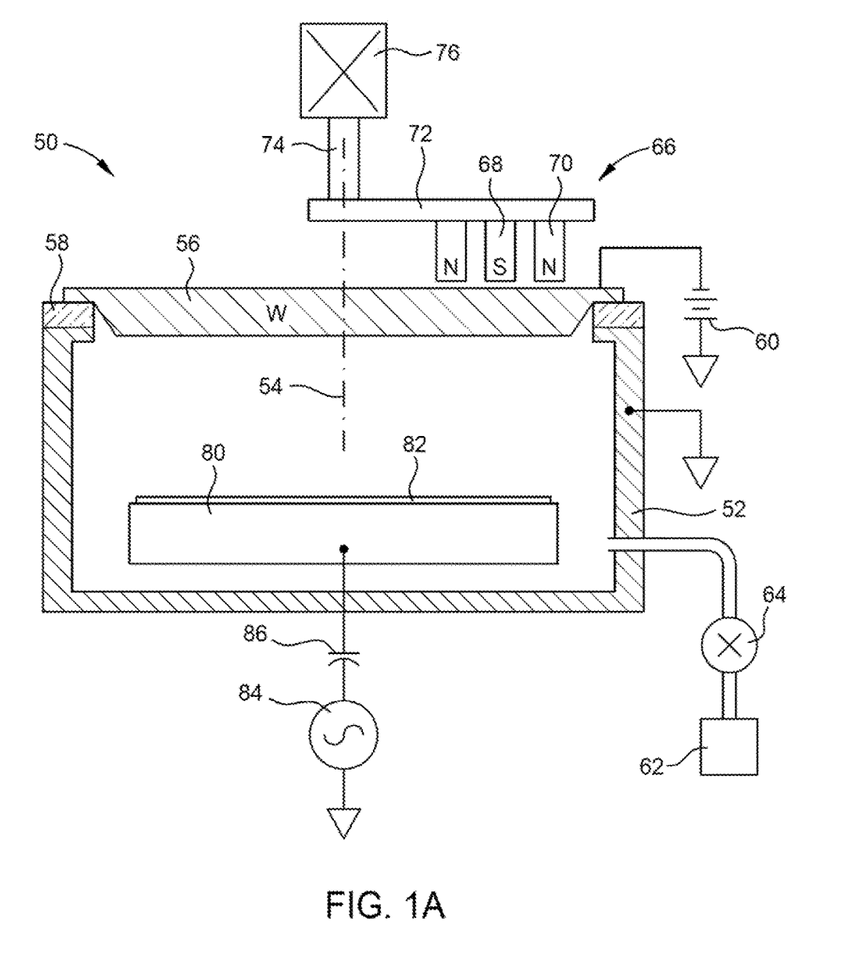
FIG. 1A is an example of a physical vapor deposition (PVD) chamber useful for performing one or more operations described herein according to at least one embodiment of the present disclosure.

FIG. 1A is an example of a processing chamber 50 useful for performing one or more operations described herein. The processing chamber 50 includes a vacuum chamber 52 arranged about a central axis 54. A target 56, which provides a source of sputtered metal, is on a central axis 54 and is supported through an isolator 58. The isolator 58 seals the target 56 to the vacuum chamber 52 and electrically isolates the target 56 from the electrically grounded vacuum chamber 52. A DC power source 60 negatively biases the target 56 with respect to the grounded vacuum chamber 52 to excite a plasma processing gas into a plasma. The plasma processing gas can be any suitable non-reactive gas such as He, Ne, Ar, Kr, Xe, $N_2$, or combinations thereof. The plasma processing gas is supplied into the vacuum chamber 52 from a gas source 62 through a mass flow controller 64. A target power excites the plasma processing gas into a plasma and ions of the plasma are accelerated towards the target 56 and sputter metal atoms from it. The density of the plasma can be increased by placing a magnetron 66 having an inner magnetic pole 68 surrounded by an outer magnetic pole 70 of the opposed magnetic polarity. The magnetic poles 68, 70 project a magnetic field into the vacuum chamber 52 parallel to the face of the target 56 to trap electrons and hence increase the plasma density and the resultant sputtering rate. The magnetic poles 68, 70 are supported on an arm 72 connected to a shaft 74 extending along the central axis 54. A motor 76 rotates the shaft 74 and the magnetron 66 about the central axis 54 to provide, e.g., azimuthal uniformity.

A pedestal 80 within the vacuum chamber 52 supports a substrate 82 in opposition to the target 56. An RF power source 84 biases the pedestal 80 through a capacitive coupling circuit 86. The RF bias in the presence of a plasma within the vacuum chamber 52 causes a negative DC self-bias to develop on the pedestal 80 so that sputtered metal ions are accelerated towards the substrate 82 and their trajectories enter deep within any high aspect-ratio holes formed in the substrate 82.

The processing chamber 50 may be part of a cluster tool. The cluster tool includes at least a first chamber and a central transfer chamber. The central transfer chamber can house a robot that shuttles substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. An example of a cluster tool which may be adapted for the present disclosure is the Endura® cluster tool, available from Applied Materials, Inc., of Santa Clara, California. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), and/or other substrate processes. By carrying out processes in a chamber on a cluster tool, surface contamination of the substrate with atmospheric impurities can be avoided without oxidation prior to depositing a subsequent film.

Figure 1B:
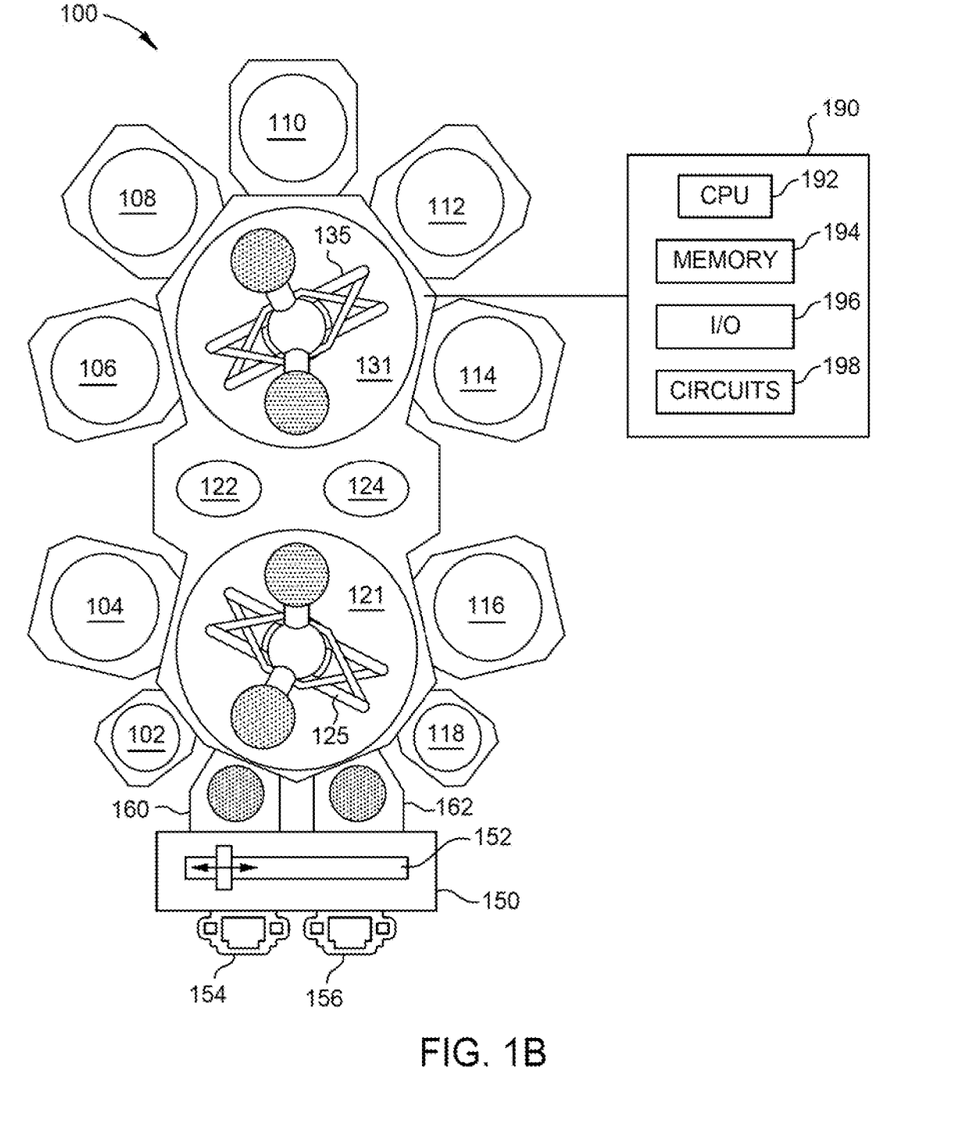
FIG. 1B is an example of a cluster tool useful for performing one or more operations described herein according to at least one embodiment of the present disclosure.

FIG. 1B is an example of a cluster tool 100 that can be used to perform one or more operations of processes described herein. The cluster tool 100 includes central transfer stations 121, 131 with a plurality of sides. Robots 125, 135 are positioned within the central transfer stations 121, 131 and are configured to move a robot blade between processing chambers 102, 104, 106, 108, 110, 112, 114, 116, and 118, and transfer chambers 122 and 124. The processing chambers 102, 104, 106, 108, 110, 112, 114, 116, and 118 provide separate processing regions isolated from adjacent process stations. The cluster tool 100 can include one or more PVD chambers, one or more CVD chambers, and/or other chambers connected to the central transfer station. At least one of the processing chambers 102, 104, 106, 108, 110, 112, 114, 116, and 118 is processing chamber 50. A factory interface 150 is connected to load lock chambers 160, 162. The factory interface 150 includes a loading chamber 154 and an unloading chamber 156. A robot 152 transfers substrates from loading chamber 154 to load lock chamber 160 and from load lock chamber 162 to unloading chamber 156.

A controller 190 is in communication with, and controls, robots 125, 135, and processing chambers 102, 104, 106, 108, 110, 112, 114, 116, and 118. The controller 190 can be a computer including a central processing unit (CPU) 192, memory 194, inputs/outputs (I/O) 196, and support circuits 198. The memory 194 or computer readable medium of the controller 190 may be one or more of readily available memory such as non-transitory memory (e.g. random access memory (RAM)), read only memory (ROM), floppy disk, hard disk, optical storage media (e.g., compact disc or digital video disc), flash drive, or any other form of digital storage, local or remote. The memory 194 can retain an instruction set that is operable by the processor (e.g., CPU 192) to control parameters and components of the cluster tool 100. The support circuits 198 are coupled to the CPU 192 for supporting the processor in a conventional manner. One or more operations of the processes described herein may be stored in the memory 194 as software routine that, when executed by the processor, causes the processor to control the operation of the cluster tool 100 or individual processing units in the manner described herein.

Figure 2:
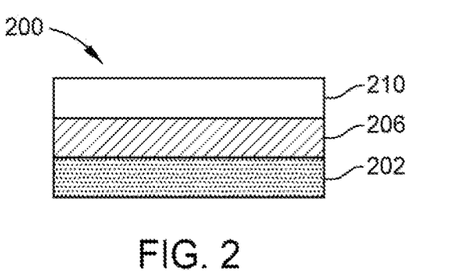
FIG. 2 is a cross-section of an example semiconductor structure according to at least one embodiment of the present disclosure.

Embodiments of the present disclosure generally relate to new and improved liner layers and processes for forming such liner layers. FIG. 2 shows a semiconductor structure 200 with a liner layer 206 disposed over a substrate 202. The substrate 202 can be, or include, any suitable material such as a dielectric material, e.g., silicon, germanium, quartz, and glass, among others. The semiconductor structure 200 can be used in a reactive ion etch (RIE) process to remove at least a portion of the metal layer 210 when forming interconnect structures.

In some embodiments, the liner layer 206 includes any suitable material such as Ti, TiN, Ta, TaN, Mo, W, Ru, or combinations thereof. In at least one embodiment, the liner layer 206 has a thickness of about 50 Å or less, such as about 30 Å or less, such as about 25 Å or less, such as about 20 Å or less, such as about 15 Å or less, such as about 10 Å or less, such as about 5 Å or less. In some embodiments, the metal layer 210 includes any suitable material such as Ru, Mo, W, Cu, Co, Ir, metal silicides, metal alloys, or combinations thereof. The metal layer 210 can have a resistivity of about 40 $\mu\Omega\cdot cm$ or less, such as about 35 $\mu\Omega\cdot cm$ or less, such as about 30 $\mu\Omega\cdot cm$ or less, such as about 25 $\mu\Omega\cdot cm$ or less, such as about 20 $\mu\Omega\cdot cm$ or less, such as about 15 $\mu\Omega\cdot cm$ or less, such as about 10 $\mu\Omega\cdot cm$ or less, such as about 5 $\mu\Omega\cdot cm$ or less. Resistivity values provided herein are measured using a four point probe. The liner layer 206 and the metal layer 210 can be formed by, e.g., process 305 (FIG. 3B) or process 355 (FIG. 3D), discussed below.

The liner layers 206 described herein represent new materials useful as liner layers. Moreover, the metal layers 210 subsequently deposited have improved resistivity relative to conventional metal layers deposited on conventional TiN liners.

Metal liners of the prior art typically exhibit a resistivity greater than 40 $\mu\Omega\cdot cm$. Such high resistivity is due to the crystal-like structure of the TiN liner causing the metal layer to grow into small grains having a size of less than about 100 nm. In addition, conventional PVD deposition of thin (e.g., about 20 Å or less) liner/etch stop layers, such as TiN-containing layers, is difficult because of nucleation sites created during the deposition. Further, when performing conventional CVD deposition of thin liner/etch stop layers, impurities can be introduced. Such nucleation sites and impurities in the liner can cause the metal layer to have high line resistance and high via resistance. In contrast, embodiments described herein enable deposition of a low-resistivity metal layer 210 (e.g., about 40 $\mu\Omega\cdot cm$ or less) on the liner layer 206. Further, the liner layer 206 shows little to no inter-diffusion of metals.

Embodiments of the present disclosure also generally relate to processes for improving conventional materials, such as TiN, used as a liner/etch stop layer. Briefly, and in some embodiments, the processes can be used to treat conventional etch stop layers made of, e.g., TiN, such that the subsequently deposited metal layer has improved resistivity. Additionally, or alternatively, the processes can be used to treat a metal seed layer deposited on conventional etch stop layers, so as to improve the resistivity of the subsequently deposited metal layer over the prior art.

Figure 3A:
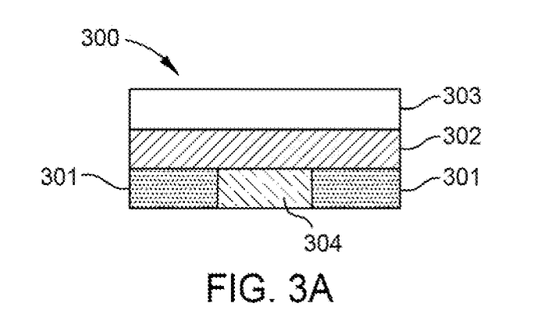
FIG. 3A a cross-section of an example semiconductor structure according to at least one embodiment of the present disclosure.

FIG. 3A shows a semiconductor structure 300 having a metal layer 303 disposed over an etch stop layer 302. The etch stop layer 302 is disposed over a substrate 301. The substrate 301 can be, or include, any suitable material such as a dielectric material, e.g., silicon, germanium, quartz, and glass, among others. In some embodiments, the substrate 301 can include a conductor 304 (e.g., plug, line, etc.) if an interconnect structure is desired or if it is connected to a front-end-of-line (FEOL) device such as a transistor, capacitor, or resistor. Additionally, or alternatively, the semiconductor structure 300 can be used in a RIE process to remove at least a portion of the metal layer 303 when forming interconnect structures. As described above, conventional TiN etch stop layers can cause the subsequently deposited metal layer to have poor resistivities because TiN itself has a crystal-like structure that grows into small grains having a size of less than about 100 nm. The treatment process described in relation to FIG. 3B, overcomes this and other issues seen in the prior art.

Figure 3B:
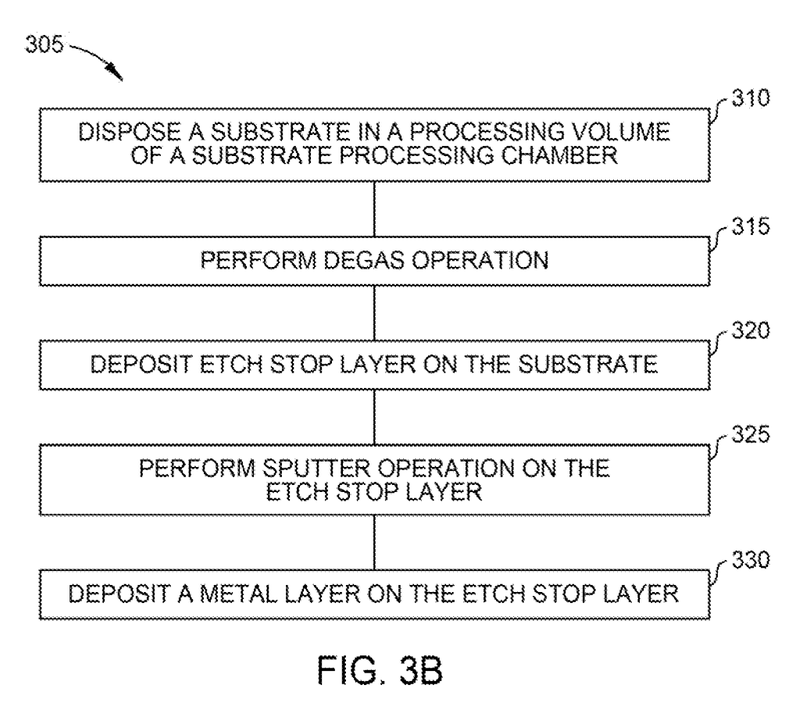
FIG. 3B is a flowchart showing selected operations of an example process for forming a low-resistivity metal layer on an etch stop layer according to at least one embodiment of the present disclosure.

FIG. 3B is a flowchart showing selected operations of a process 305 for forming a semiconductor structure 300. The process 305 enables use of conventional etch stop materials if desired, though other etch stop materials can be used. The process 305 includes a treatment process to amorphize the surface of the etch stop layer 302 such that metal(s) of the metal layer 303 can grow into large grains having a size from about 100 nm to about 2-3 μm. The large grains of the metal(s) of the metal layer 303, result in adhesion of the metal layer 303 to the etch stop layer 302 and produce a metal layer 303 having a resistivity of about 40 $\mu\Omega\cdot cm$ or less.

One or more operations of process 305 shown in FIG. 3B can be performed without a vacuum break, such that the operations of process 305 can be integrated in a single tool. By utilizing processes that are free of vacuum break(s), oxidation of the etch stop layer is eliminated (or at least mitigated) and the resistivity of the metal layer 303 subsequently deposited is improved over the prior art. Accordingly, and in some embodiments, one or more operations of process 305 can be performed in cluster tool 100 or other suitable tool.

Process 305 includes disposing a substrate 301 in a processing volume of a processing chamber at operation 310. The substrate 301 undergoes a degas process at operation 315 which, e.g., evaporates contaminants and prevents contaminants from sticking on the substrate 301. The degas process can include heating the substrate 301 with, e.g., an infrared (IR) light source and/or a hot-plate heater in an inert gas environment at a temperature from about 150° C. to about 400° C. A wet clean can also be performed prior to the degas operation in order to help remove contaminants.

The etch stop layer 302 is then deposited by a PVD process on the substrate 301 at operation 320. The PVD processing chamber shown in FIG. 1A can be used, though other PVD chambers are contemplated. The etch stop layer 302 can include any suitable material such as Ti, TiN, Ta, TaN, Mo, W, Ru, or combinations thereof. In some embodiments, the etch stop layer 302 has a thickness from about 5 Å to about 50 Å, such as from about 10 Å to about 30 Å, such as about 15 Å to about 25 Å. In at least one embodiment, the etch stop layer can have a thickness of about 30 Å or less, such as about 25 Å or less, such as about 20 Å or less, such as about 15 Å or less, such as about 10 Å or less.

As an example of the PVD process of operation 320, a target 56 including the etch stop material is provided in processing chamber 50 illustrated in FIG. 1A. The pedestal 80 includes a heated electrostatic chuck at a temperature from about 100° C. to about 400° C., such as from about 200° C. to about 300° C. The pedestal 80 within the processing chamber 50 supports substrate 301 in opposition to the target 56 to be coated with the etch stop layer 302 sputtered from the target 56. An RF power source biases the pedestal 80 supporting the substrate 301 through a capacitive coupling circuit. The pedestal is conductive so that it acts as an electrode. The RF bias in the presence of a plasma within the processing chamber 50 causes a negative DC self-bias to develop on the pedestal 80 so that sputtered etch stop material ions are accelerated towards the substrate 301 and their trajectories enter deep within any high aspect-ratio holes formed in the substrate 301. In some embodiments, the etch stop layer 302 is deposited at a pressure from about 5 mTorr to about 20 mTorr, at a substrate temperature of about 100° C. to about 400° C., such as from about 200° C. to about 300° C. The gas flow in processing chamber 50 can be set to a flow rate of about 15 sccm to about 150 sccm. The RF power source can be set at 1 kW to about 10 kW, such as from about 2 kW to about 3 kW.

The etch stop layer 302 is then subjected to a sputter process at operation 325. Here, the etch stop layer 302 is bombarded with suitable ions such as He ions, Ne ions, Ar ions, Kr ions, Xe ions, or combinations thereof, to amorphize or substantially amorphize the etch stop layer 302. Because the etch stop layer 302 is amorphous as a result of the sputter process, the metal layer 303 grown thereon has a resistivity of about 40 $\mu\Omega\cdot cm$ or less and adhesion between the metal layer 303 and the etch stop layer 302 is observed.

The sputter process of operation 325 can be performed in a sputter chamber, such as a pre-clean/pre-treatment chamber, such as a PC XT™ chamber or a PC XTe™ chamber available from Applied Materials, Inc. of Santa Clara, California, though other chambers are contemplated. As an example of the sputter process of operation 325, the substrate 301 having the etch stop layer 302 disposed thereon is disposed within a processing chamber such as a pre-clean/pre-treatment chamber. The pre-clean/pre-treatment chamber can also include a pedestal supporting the substrate. The pedestal includes a heated electrostatic chuck to heat the substrate 301 at a temperature less than about 500° C., such as from about 200° C. to about 450° C., such as from about 250° C. to about 350° C. A pressure inside the pre-clean/pre-treatment chamber can be from about 5 mTorr to about 100 mTorr, such as from about 5 mTorr to about 50 mTorr. A sputter gas that includes any suitable sputter gas such as He, Ne, Ar, Kr, or Xe, or combinations thereof, is flowed into the pre-clean/pre-treatment chamber and excited into a plasma to bombard the etch stop layer 302 with ions. The gas flow rate of the sputter gas into the sputter chamber can be from about 3 sccm to about 100 sccm, such as from about 10 sccm to about 50 sccm. The sputter process of operation 325 can be performed for a duration of less than about 5 minutes (min), such as less than about 3 min, such as less than about 1 min, such as less than about 30 seconds (s), such as less than about 20 s, such as from less than about 10 s.

The sputter process at operation 325 can be performed with an RF bias power from about 500 W to about 600 W and a plasma power from about 200 W to about 600 W. A DC power source can be utilized to negatively bias the target from about 500 W to about 10 kW, such as from about 900 W to about 8 kW, such as from about 1 kW to about 2 kW with respect to the grounded pre-clean/pre-treatment chamber or grounded sidewall shield to excite the sputter gas into a plasma. An AC power source (not shown in FIG. 1A) can be utilized to bias the substrate 301 such that only certain species of particles with a minimum energy and vertical trajectory to hit the substrate 301 having the etch stop layer 302 disposed thereon. Other species with less energy and at a flat angle of incidence will be prevented from hitting the substrate. The AC substrate bias power can be set to a power from about 0 W to about 500 W, such as from about 200 W to about 400 W.

The metal layer 303 is then deposited on the etch stop layer 302 at operation 330. In some embodiments, the metal layer 303 includes any suitable material such as Ru, Mo, W, Cu, Co, Ir, metal silicides, metal alloys, or combinations thereof. The metal layer 303 is typically deposited, using a PVD process. As an example of the deposition process of operation 330, a target 56 including the metal to be sputtered (e.g., W, Ru, etc.) to deposit a metal layer 303 is provided in a processing chamber such as the processing chamber 50 illustrated in FIG. 1A. The processing chamber 50 can also include a pedestal supporting the substrate 301. The pedestal 80 includes a heated electrostatic chuck to heat the substrate 301 at a temperature less than about 500° C., such as from about 200° C. to about 450° C., such as from about 250° C. to about 350° C. A pressure inside the processing chamber 50 can be from about 5 mTorr to about 100 mTorr, such as from about 5 mTorr to about 50 mTorr. A sputter gas that includes any suitable non-reactive gas such as He, Ne, Ar, Kr, Xe, or combinations thereof, is flowed into the processing chamber 50 and excited into a plasma to deposit the metal layer 303 on the etch stop layer 302.

A DC power source 60 can be utilized to negatively bias the target 56 from about 500 W to about 10 kW, such as from about 900 W to about 8 kW, such as from about 1 kW to about 2 kW with respect to the grounded processing chamber 50 or grounded sidewall shield to excite the sputter gas into a plasma. An AC power source (not shown in FIG. 1A) can be utilized to bias the substrate. If an AC power source is used, the AC substrate bias power can be set to a power from about 0 W to about 500 W, such as from about 200 W to about 400 W. The metal layer 303 produced from operation 330 can have a thickness of about 50 Å to about 500 Å, such as from about 100 Å to about 400 Å, such as from about 200 Å to about 300 Å. The metal layer 303 can have a resistivity of about 40 $\mu\Omega\cdot cm$ or less, such as about 35 $\mu\Omega\cdot cm$ or less, such as about 30 $\mu\Omega\cdot cm$ or less, such as about 25 $\mu\Omega\cdot cm$ or less, such as about 20 $\mu\Omega\cdot cm$ or less, such as about 15 $\mu\Omega\cdot cm$ or less, such as about 10 $\mu\Omega\cdot cm$ or less, such as about 5 $\mu\Omega\cdot cm$ or less.

Figure 3C:
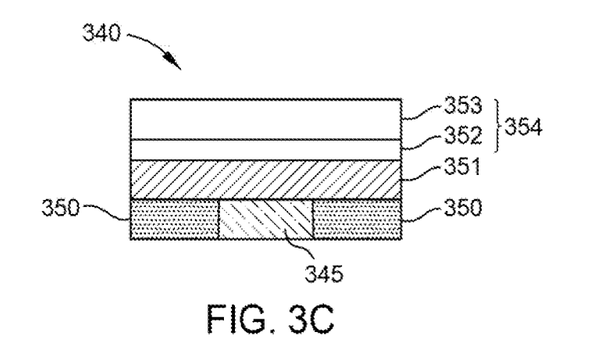
FIG. 3C is a cross-section of an example semiconductor structure according to at least one embodiment of the present disclosure.

FIG. 3C shows a semiconductor structure 340 having a metal layer 354 disposed over an etch stop layer 351 and the etch stop layer 351 disposed over a substrate 350. The metal layer includes a metal seed layer 352 and a bulk metal layer. The substrate 350 can be, or include, any suitable material such as a dielectric material, e.g., silicon, germanium, quartz, and glass, among others. In some embodiments, the substrate 350 can include a conductor 345 (e.g., plug, line, etc.) if an interconnect structure is desired or if it is connected to a FEOL device such as a transistor, capacitor, or resistor. Additionally, or alternatively, the semiconductor structure 340 can be used in a RIE process to remove at least a portion of the metal layer 354 when forming interconnect structures.

As described above, etch stop layers deposited by prior art methods can cause the subsequently deposited metal layer to have poor resistivity because the etch stop layer itself has a crystal-like structure that grows into small grains having a size of less than about 100 nm. Process 355 illustrated in FIG. 3D overcomes this issue. Briefly, the process 355 includes a treatment process to amorphize the surface of the metal seed layer 352 such that materials of the metal seed layer and bulk metal layer 353 deposited thereon can grow into large grains having a size of greater than about 100 nm, up to about 2-3 μm. The large grains of the metal layer 354 result in excellent adhesion of the metal layer 354 to the etch stop layer 351 and produce a metal layer 354 having a resistivity of less than about 40 µΩ·cm. Moreover, the process 355 enables use of, e.g., conventional etch stop materials if desired, though other etch stop materials can be used.

Figure 3D:
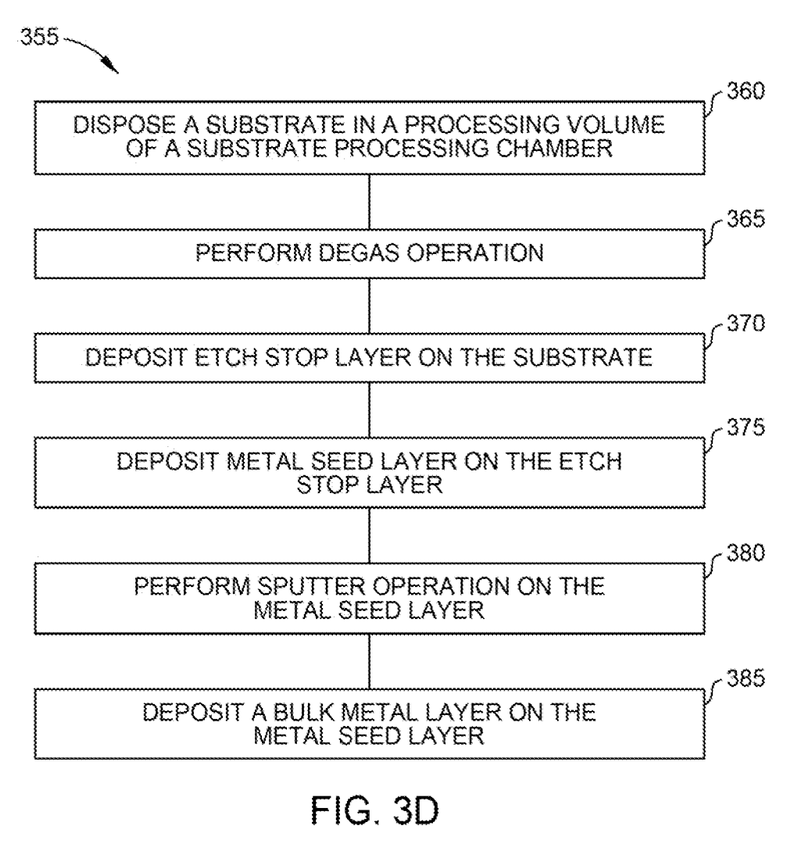
FIG. 3D is a flowchart showing selected operations of an example process for forming a low-resistivity metal layer on an etch stop layer according to at least one embodiment of the present disclosure.

FIG. 3D is a flowchart showing selected operations of a process 355 for forming a metal layer 354 on an etch stop layer 351. Process 355 shown in FIG. 3D may be performed without a vacuum break, such that the operations of process 355 are integrated. By utilizing operations that are free of vacuum break(s), oxidation of the metal seed layer 352 is eliminated (or at least mitigated) and the resistivity of the metal layer 354 is improved over the prior art. Accordingly, and in some embodiments, one or more operations of process 355 of FIG. 3D can be performed in cluster tool 100 or other suitable tool.

Process 355 includes disposing a substrate 350 in a processing volume of a processing chamber 50 (FIG. 1A) at operation 360. The substrate 350 then undergoes a degas process at operation 365. The degas process of operation 365 can be the same as, or similar to, operation 315 of FIG. 3B. A wet clean can also be performed prior to the degas operation in order to help remove contaminants. The etch stop layer 351 is then deposited on the substrate 350 by a PVD process at operation 370. The deposition of etch stop layer 351 of operation 370 can be the same as, or similar to, operation 320 of FIG. 3B. The etch stop layer 351 can include any suitable material such as Ti, TiN, Ta, TaN, Mo, W, Ru, or combinations thereof.

A metal seed layer 352 is then deposited on the etch stop layer 351 at operation 375. The deposition of the metal seed layer 352 can be deposited using a PVD process in a PVD chamber such as processing chamber 50 of FIG. 1A or other suitable chamber. The deposition of the metal seed layer 352 (operation 375) can be the same as, or similar to, operation 330 of FIG. 3B. The thickness of the metal seed layer 352 deposited in operation 375 can be about 80 Å or less, such as from about 5 Å to about 50 Å, such as from about 10 Å to about 40 Å, such as from about 15 Å to about 30 Å, such as from about 20 Å to about 25 Å. In some embodiments, the metal seed layer 352 includes any suitable material such as Ru, Mo, W, Cu, Co, Ir, metal silicides, metal alloys, or combinations thereof.

The metal seed layer 352 is then subjected to a sputter process at operation 380. Here, the metal seed layer 352 is bombarded with suitable ions such as He ions, Ne ions, Ar ions, Kr ions, Xe ions, or combinations thereof, to amorphize or substantially amorphize the metal seed layer 352. The sputter process of operation 380 can be the same as, or similar to, operation 325 of FIG. 3B.

The bulk metal layer 353 is then deposited on the metal seed layer 352 at operation 385. The deposition of the bulk metal layer 353 can be performed using a PVD process in a PVD chamber such as processing chamber 50 of FIG. 1A. Deposition of the bulk metal layer 353 of operation 385 can be the same as, or similar to, operation 330 of FIG. 3B. The thickness of the bulk metal layer 353 deposited can be about 450 Å or less, such as about 400 Å or less, such as from about 100 Å to about 400 Å, such as from about 150 Å to about 350 Å, such as from about 200 Å to about 300 Å. In some embodiments, the bulk metal layer 353 deposited includes any suitable material such as Ru, Mo, W, Cu, Co, Ir, metal silicides, metal alloys or combinations thereof. In some embodiments, the bulk metal layer 353 includes the same material as the metal seed layer 352. Alternatively, and in at least one embodiment, the bulk metal layer 353 includes a different material from the metal seed layer 352.

The resultant metal layer 354 has a thickness of about 550 Å or less, such as from 50 Å to about 500 Å, such as from about 100 Å to about 400 Å, such as from about 200 Å to about 300 Å. The metal layer 354 produced from operation 380 and operation 385 can have a resistivity of about 40 µΩ·cm or less, such as about 35 µΩ·cm or less, such as about 30 µΩ·cm or less, such as about 25 µΩ·cm or less, such as about 20 µΩ·cm or less, such as about 15 µΩ·cm or less, such as about 10 µΩ·cm or less, such as about 5 µΩ·cm or less.

In the process shown in FIG. 3D, the metal layer 354 includes a metal seed layer 352 that is deposited first, and then a bulk metal layer 353 deposited later. A sputter process is performed between the deposition of the metal seed layer 352 and the bulk metal layer 353. Without wishing to be bound by theory, it is believed that depositing the metal seed layer 352, followed by deposition of the bulk metal layer 353, improves the metal grain structure and the resistivity of the metal layer 354.

Embodiments of the present disclosure also generally relate to processes for forming a selective metal liner on a pre-formed via followed by deposition of a metal layer having low resistivity. Such processes are useful for forming, e.g., semiconductor structures such as multi-level interconnect structures.

Figure 4A:
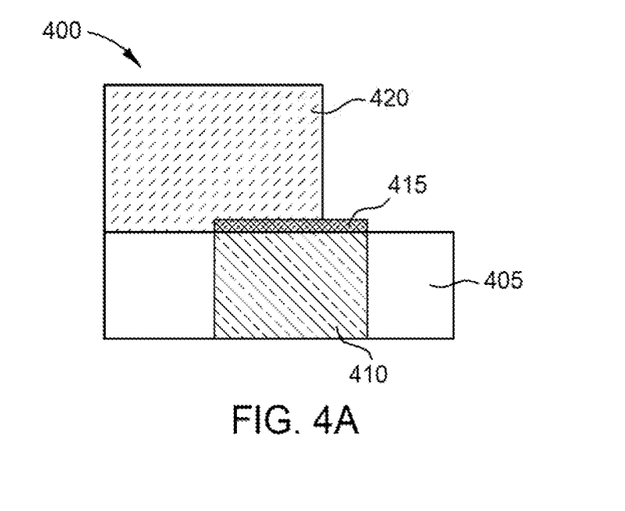
FIG. 4A is a cross-section of an example semiconductor structure according to at least one embodiment of the present disclosure.

FIG. 4A shows a semiconductor structure 400 having a substrate 405 with a via hole 410 (or via plug) formed therein. The substrate 405 can be, or include, any suitable material such as a dielectric material, e.g., silicon, germanium, quartz, and glass, among others. The substrate 405 can represent a structure which is contacted with an underlying semiconductor structure to connect the interconnect structure with an underlying semiconductor device.

The via hole 410 can be at least partially filled with any suitable material such as a metal material, such as Ru, W, Mo, Co, Ti, TiN, or combinations thereof. An etch stop layer 415 (or liner layer) is selectively disposed over the via hole 410. A metal layer 420 is disposed above at least a portion of the substrate 405 and is disposed over at least a portion of the etch stop layer 415. Typically, the material used to form the etch stop layer 415 is different from the material utilized to form the metal layer. In some embodiments, the etch stop layer 415 includes any suitable material such as Ti, TiN, Ta, TaN, Mo, W, Ru, or combinations thereof. The metal layer 420 can include any suitable material such as Ru, Mo, W, Cu, Co, Ir, metal silicides, metal alloys, or combinations thereof. The semiconductor structure 400 shown in FIG. 4A can be used in a RIE process to remove at least a portion of the metal layer 420 when forming interconnect structures.

Figure 4B:
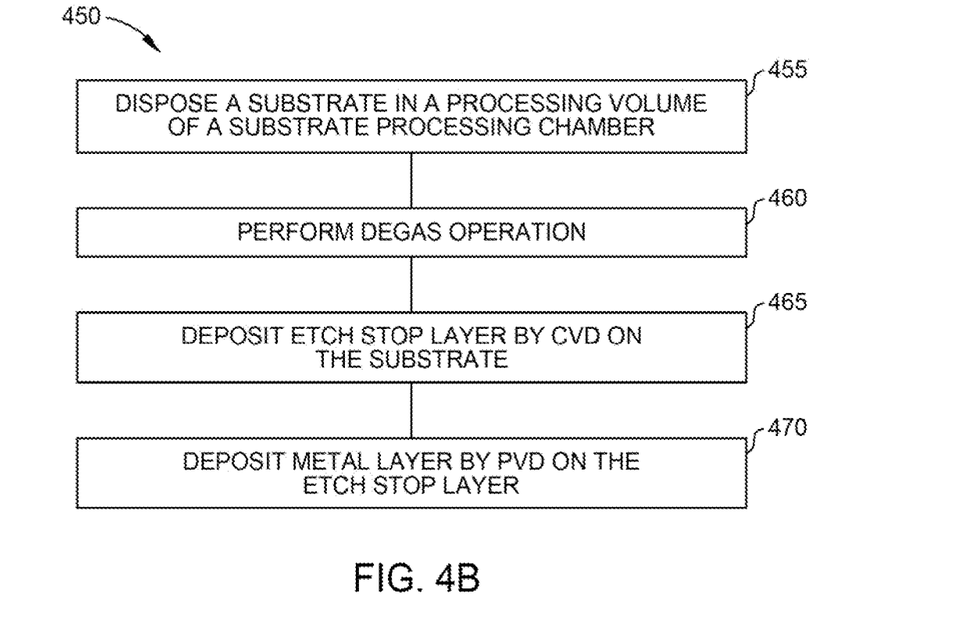
FIG. 4B is a flowchart showing selected operations of an example process for forming a multi-level interconnect structure according to at least one embodiment of the present disclosure.

Conventional methods for depositing etch stop layers typically leads to residual etch stop materials on undesired surfaces of the substrate. These residual materials result in current leakage when not sufficiently removed. In contrast, the inventors found a process to overcome these and other issues. For example, process 450 enables low-leakage integration using selective metal etch stops, deposited only on metal vias instead of on the dielectric films.

FIG. 4B is a flowchart showing selected operations of a process 450 for fabricating a semiconductor structure such as a multi-level interconnect structure (e.g., metal wires in ohmic contact with underlying vias). Process 450 enables, e.g., selective deposition of the etch stop layer 415 to be performed on the via hole 410 formed in the substrate 405 while minimizing (or eliminating) deposition of the etch stop layer on the dielectric material of the substrate 405. One or more operations of the process shown in FIG. 4B may be performed without a vacuum break, such that the operations are integrated in a single tool. By utilizing processes that are free of vacuum break(s), oxidation of the etch stop layer is eliminated (or at least mitigated) and the resistivity of the metal layer 420 subsequently deposited is improved over the prior art. Accordingly, and in some embodiments, one or more operations of process 450 can be performed in cluster tool 100 or other suitable tool.

Process 450 includes disposing a substrate 405 in a processing volume of a processing chamber at operation 455. The substrate 405 undergoes a degas process at operation 460 which, e.g., evaporates contaminants and prevents contaminants from sticking on the substrate 405. The degas process can include heating the substrate 405 with, e.g., an IR light source and/or a hot-plate heater in an inert gas environment at a temperature from about 150° C. to about 400° C. A wet clean can also be performed prior to the degas operation in order to help remove contaminants.

The etch stop layer 415 is then deposited by a CVD process on the substrate 405 at operation 465. Here, the etch stop layer 415 is deposited selectively on the material in the via hole 410, such that the dielectric material of the substrate 405 is free of, or substantially free of, the material used to form the etch stop layer 415. That is, the selective deposition process does not form the etch stop layer 415 on the top surface of the substrate 405, preventing it from shorting the neighboring lines/conductive elements. The etch stop layer 415 is believed to improve electro-migration performance of the underlying metal layer and dielectric barrier adhesion relative to the prior art. The etch stop layer 415 can include any suitable material such as Ti, TiN, Ta, TaN, Mo, W, Ru, Co, Ni, Au, Ag, Mn, Sn, Al, or combinations thereof.

The selective deposition process may be precursor and surface dependent. The selective deposition process may be performed using any suitable technique such as a plasma treatment, a plasma-enhanced CVD, plasma-enhanced ALD, or any combinations thereof. Alternatively, the selective deposition process may be performed using a thermal surface treatment with different chemistry (without plasma) to achieve selectivity. The etch stop layer 415 may also be applied using plating, electroplating or other suitable deposition techniques such as CVD, PVD, ALD, etc.

As an example of the CVD process of operation 465, a metal containing precursor may be introduced into a processing chamber in which the workpiece is positioned at a flow rate of about 10 sccm to about 3,000 sccm, for example about 20 sccm to about 1,500 sccm, such as about 30 sccm to about 200 sccm (for a 300 mm substrate). The temperature of the workpiece or the substrate pedestal during process can be from about 200° C. to about 800° C., such as from about 350° C. to about 550° C., for example from about 400° C. to about 500° C. In some embodiments, the workpiece can be heated and maintained at a temperature from about 100° C. to about 600° C., such as from about 120° C. to about 500° C., for example from about 150° C. to about 425° C. The processing chamber may have a controlled environment that is pressurized from about 1 mTorr to about 100 Torr, such as from about 1 Torr to about 10 Torr, for example from about 2 Torr to about 5 Torr.

During formation of the etch stop layer 415, the substrate can be exposed to a metal-containing precursor to dope and react with the etch stop layer 415, or form an alloy layer on a top surface of the etch stop layer 415. Although not shown in FIG. 4A, the alloy layer can be located above the etch stop layer 415 and below metal layer 420.

In some examples, where the etch stop layer 415 is formed from cobalt, exposure of the workpiece to an aluminum-containing precursor can selectively turn the etch stop layer 415 into a cobalt-containing alloy, and/or form a cobalt-containing alloy, for example a cobalt-aluminum alloy, on the etch stop layer 415. In some embodiments, the etch stop layer 415 or the cobalt-aluminum alloy layer may be formed by a selective Co deposition followed by selective Al deposition. In some embodiments, the etch stop layer 415 or the cobalt-aluminum alloy layer may be formed by a selective Al deposition followed by selective Co deposition. In some embodiments, the cobalt-aluminum alloy may be formed by a selective cyclic process such as Co—Al—Co—Al depositions. In such cases, the substrate may be exposed to a cobalt-containing precursor and an aluminum-containing precursor in an alternating manner until a desired thickness is reached. In some embodiments, the cobalt-aluminum alloy layer may be formed by co-flowing a cobalt-containing precursor and an aluminum-containing precursor.

Suitable cobalt-containing precursors include methylcyclopentadienyl cobalt bis(carbonyl) (MeCpCo(CO)$_2$), ethylcyclopentadienyl cobalt bis(carbonyl) (EtCpCo(CO)$_2$), dicobalt octa(carbonyl) (Co$_2$(CO)$_8$), nitrosyl cobalt tris(carbonyl) ((ON)Co(CO)$_3$), or combinations thereof. Suitable cobalt-containing precursors also include cobalt carbonyl compounds or complexes, such as cyclopentadienyl cobalt bis(carbonyl) (CpCo(CO)$_2$), tricarbonyl allyl cobalt ((CO)$_3$Co(CH$_2$CH=CH$_2$)), dicobalt hexacarbonyl bytylacetylene (CCTBA, (CO)$_6$Co$_2$(HC≡CtBu)), dicobalt hexacarbonyl methylbutylacetylene ((CO)$_6$Co$_2$(MeC≡CtBu)), dicobalt hexacarbonyl phenylacetylene ((CO)$_6$Co$_2$(HC≡CPh)), or combinations thereof. Suitable cobalt-containing precursors also include cobalt amidinates or cobalt amido complexes, such as bis(di(butyldimethylsilyl)amido) cobalt (((BuMe$_2$Si)$_2$N)$_2$Co), bis(di(ethyldimethylsilyl)amido) cobalt (((EtMe$_2$Si)$_2$N)$_2$Co), bis(di(propyldimethylsilyl)amido) cobalt (((PrMe$_2$Si)$_2$N)$_2$Co), bis(di(trimethylsilyl)amido) cobalt (((Me$_3$Si)$_2$N)$_2$Co), or combinations thereof. In some embodiments, the cobalt-containing precursor can include more than one of the above cobalt-containing precursors.

Suitable aluminum-containing precursor include dimethylaluminum hydride (DMAH), trimethylaluminum (TMA, Al$_2$Me$_6$ or (AlMe$_3$)$_2$), triethylaluminum (Al$_2$Et$_6$ or TEA), tritertiarybutylaluminum (TTBA), aluminum hydride (AlH$_3$), or combinations thereof. While an aluminum-containing precursor is discussed herein, it should be appreciated that other suitable doping precursors, such as Ru, Mn, or W, may also be used to react with the etch stop layer 415 to turn the etch stop layer 415 and/or form an alloy layer thereon.

A metal layer 420 is then deposited on the etch stop layer 415 at operation 470. The metal layer 420 can be deposited using a PVD process to a thickness of about 50 Å to about 500 Å, such as from about 100 Å to about 400 Å, such as from about 200 Å to about 300 Å. Deposition of the metal layer 420 of operation 470 can be the same as, or similar to, operation 330 of FIG. 3B.

In some embodiments, the metal layer 420 includes any suitable material such as Ru, Mo, W, Cu, Co, Ir, metal silicides, metal alloys, or combinations thereof. In at least one embodiment, the material used to form the metal layer 420 is different from the material used to form the etch stop layer 415. For example, when the metal layer 420 is a W layer, the etch stop layer 415 can be a Ru layer. That is, the metal layer 420 is free of, or substantially free of, Ru, and the etch stop layer 415 is free of, or substantially free of, W. As another example, when the metal layer 420 is a Ru layer, the etch stop layer 415 can be a W layer. In this example, the metal layer 420 is free of, or substantially free of, W, and the etch stop layer 415 is free of, or substantially free of, Ru. The metal layer 420 can have a resistivity of about 40 µΩ·cm or less, such as about 35 µΩ·cm or less, such as about 30 µΩ·cm or less, such as about 25 µΩ·cm or less, such as about 20 µΩ·cm or less, such as about 15 µΩ·cm or less, such as about 10 µΩ·cm or less, such as about 5 µΩ·cm or less.

Figure 5A:
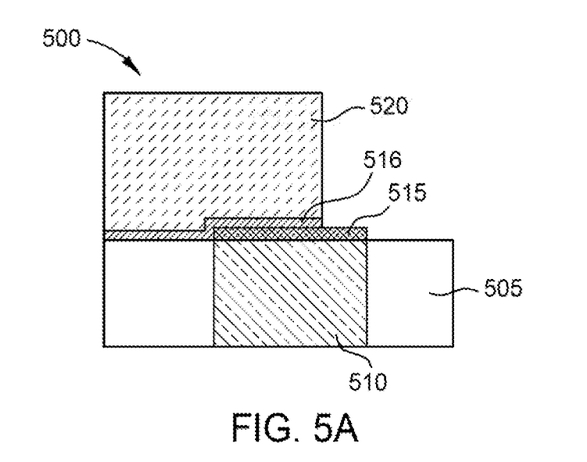
FIG. 5A is a cross-section of an example semiconductor structure according to at least one embodiment of the present disclosure.

FIG. 5A shows a semiconductor structure 500 having a substrate 505 with a via hole 510 (or via plug) formed therein. The substrate 505 can be, or include, any suitable material such as a dielectric material, e.g., silicon, germanium, quartz, and glass, among others. The substrate 505 can represent a structure which is contacted with an underlying semiconductor structure to connect the interconnect structure with an underlying semiconductor device. The via hole 510 can be at least partially filled with any suitable material such as a metal material, such as Ru, W, Mo, Co, Ti, TiN, or combinations thereof. An etch stop layer 515 (or liner layer) is selectively disposed over the via hole 510. An adhesion layer 516 is disposed over at least a portion of the etch stop layer 515 and is disposed over at least a portion of the substrate 505. A metal layer 520 is disposed above at least a portion of the adhesion layer 516. The semiconductor structure 500 can be used in a RIE process to remove at least a portion of the metal layer 520 when forming interconnect structures.

Figure 5B:
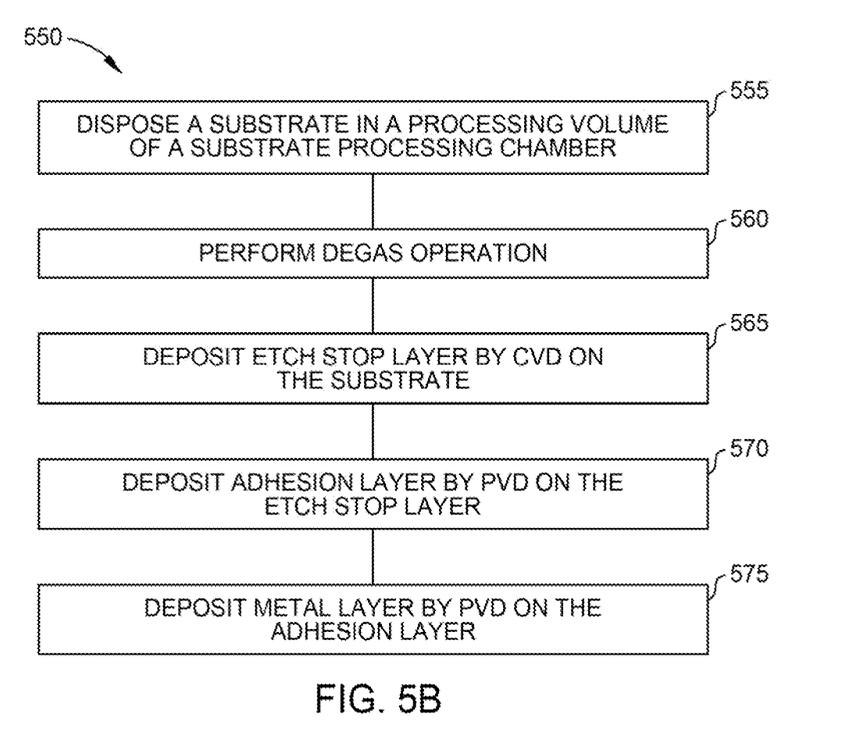
FIG. 5B is a flowchart showing selected operations of an example process for forming a multi-level interconnect structure according to at least one embodiment of the present disclosure.

FIG. 5B is a flowchart showing selected operations of a process 550 for fabricating a semiconductor structure such as a multi-level interconnect structure (e.g., metal wires in ohmic contact with underlying vias). The process 550 enables, e.g., robust adhesion of the structure without degrading wire resistance or via contact resistance. One or more operations of the process shown in FIG. 5B may be performed without a vacuum break, such that the operations are integrated in a single tool. By utilizing processes that are free of vacuum break(s), oxidation of the etch stop layer is eliminated (or at least mitigated) and the resistivity of the metal layer 520 subsequently deposited is improved over the prior art. Accordingly, and in some embodiments, one or more operations of process 550 can be performed in cluster tool 100 or other suitable tool.

Process 550 includes disposing a substrate 505 in a processing volume of a processing chamber at operation 555. The substrate 505 undergoes a degas process at operation 560 which, e.g., evaporates contaminants and prevents contaminants from sticking on the substrate 505. The degas process can include heating the substrate 505 with, e.g., an IR light source and/or a hot-plate heater in an inert gas environment at a temperature from about 150° C. to about 400° C. A wet clean can also be performed prior to the degas operation in order to help remove contaminants.

The etch stop layer 515 is then deposited by a CVD process on the substrate 505 at operation 565. Here, the etch stop layer 515 is deposited selectively on the via hole 510, such that the dielectric material of the substrate 505 is free of, or substantially free of, material used to form the etch stop layer 515. The etch stop layer 515 can include any suitable material such as Ti, TiN, Ta, TaN, Mo, W, Ru, or combinations thereof. The CVD deposition of operation 565 can be the same as, or similar to, operation 465 of FIG. 4B.

At operation 570, then adhesion layer 516 is then deposited on at least a portion of the etch stop layer 515 and at least a portion of the substrate 505. The adhesion layer 516 can be deposited using a PVD process to a thickness of about 1 Å to about 100 Å, such as from about 1 Å to about 10 Å, such as from about 3 Å to about 5 Å. The adhesion layer 516 includes any suitable material such as Ti, TiN, Ta, TaN, Mo, W, Ru, or combinations thereof. In at least one embodiment, the material used to form the adhesion layer 516 is different from the material used to form the etch stop layer 515. For example, when the adhesion layer 516 is a Ti layer, the etch stop layer 515 can be a Ru layer and/or a W layer. That is, the adhesion layer 516 is free of, or substantially free of, Ru and/or W, and the etch stop layer 515 is free of, or substantially free of, Ti. The PVD process of operation 570 to form the adhesion layer 516 can be the same as, or similar to, operation 330 of FIG. 3B.

A metal layer 520 is then deposited on the adhesion layer 516 at operation 575. The metal layer 520 is typically deposited using a PVD process to a thickness of about 50 Å to about 500 Å, such as from about 100 Å to about 400 Å, such as from about 200 Å to about 300 Å. Deposition of the metal layer 520 of operation 575 can be the same as, or similar to, operation 330 of FIG. 3B.

In some embodiments, the metal layer 520 includes any suitable material such as Ru, Mo, W, Cu, Co, Ir, metal silicides, metal alloys, or combinations thereof. In at least one embodiment, the material used to form the metal layer 520 is different from the material used to form the adhesion layer 516. For example, when the metal layer 520 is a W layer, the adhesion layer 516 can be a Ru layer. That is, the metal layer 520 is free of, or substantially free of, Ru, and the adhesion layer 516 is free of, or substantially free of, W. The metal layer 520 produced from operation 575 can have a resistivity of about 40 µΩ·cm or less, such as about 35 µΩ·cm or less, such as about 30 µΩ·cm or less, such as about 25 µΩ·cm or less, such as about 20 µΩ·cm or less, such as about 15 µΩ·cm or less, such as about 10 µΩ·cm or less, such as about 5 µΩ·cm or less.

Figure 6A:
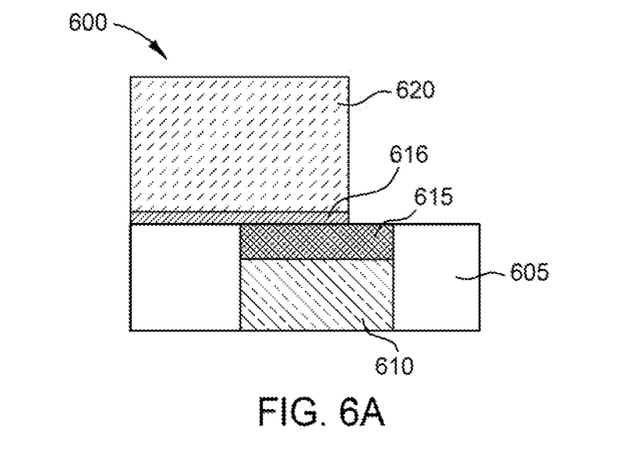
FIG. 6A is a cross-section of an example semiconductor structure according to at least one embodiment of the present disclosure.

FIG. 6A shows a semiconductor structure 600 having a substrate 605 with a via hole 610 (or via plug) formed therein. The substrate 605 can be, or include, any suitable material such as a dielectric material, e.g., silicon, germanium, quartz, and glass, among others. The substrate 605 can represent a structure which is contacted with an underlying semiconductor structure to connect the interconnect structure with an underlying semiconductor device. The via hole 610 is at least partially filled with a metal material (e.g., Ru, W, Mo, Co, Ti, TiN, and others, or combinations thereof), and at least partially filled with an etch stop layer 615 (or liner layer). An adhesion layer 616 is disposed over at least a portion of the etch stop layer 615 and is disposed over at least a portion of the substrate 605. A metal layer 620 is disposed above at least a portion of the adhesion layer 616. The semiconductor structure 600 can be used in a RIE process to remove at least a portion of the metal layer 620 when forming interconnect structures.

Figure 6B:
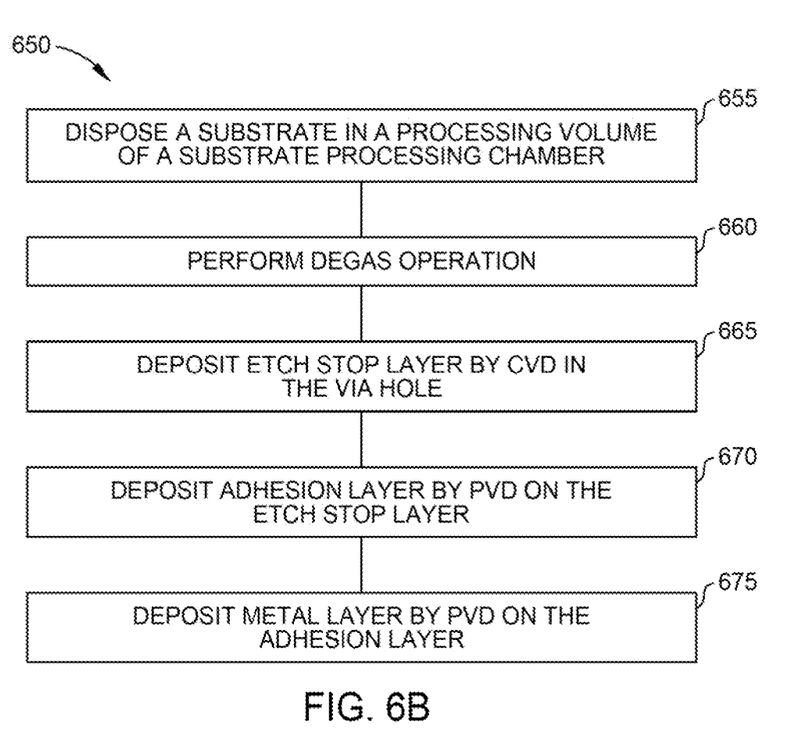
FIG. 6B is a flowchart showing selected operations of an example process for forming a multi-level interconnect structure according to at least one embodiment of the present disclosure.

FIG. 6B is a flowchart showing selected operations of a process 650 for fabricating a semiconductor structure such as a multi-level interconnect structure (e.g., metal wires in ohmic contact with underlying vias). Process 650 is an alternate approach to build desirable features having low resistivity, improved etch stop characteristics, and improved adhesive characteristics. One or more operations of the process shown in FIG. 6B may be performed without a vacuum break, such that the operations are integrated in a single tool. By utilizing processes that are free of vacuum break(s), oxidation of the etch stop layer is eliminated (or at least mitigated) and the resistivity of the metal layer 620 subsequently deposited is improved over the prior art.

Accordingly, and in some embodiments, one or more operations of process 650 can be performed in cluster tool 100 or other suitable tool.

Process 650 includes disposing a substrate 605 in a processing volume of a processing chamber at operation 555. The substrate 605 undergoes a degas process at operation 660 which, e.g., evaporates contaminants and prevents contaminants from sticking on the substrate 605. The degas process can include heating the substrate 605 with, e.g., an IR light source and/or a hot-plate heater in an inert gas environment at a temperature from about 150° C. to about 400° C. A wet clean can also be performed prior to the degas operation in order to help remove contaminants.

At this stage, at least a portion of the via hole 610 is empty. The etch stop layer 615 is then deposited by a CVD process selectively in the via hole 610 at operation 665, such that the dielectric material of the substrate 605 is free of, or substantially free of, material used to form the etch stop layer 615. The CVD deposition of operation 665 can be the same as, or similar to, operation 465 of FIG. 4B. The etch stop layer 615 can include any suitable material such as Ti, TiN, Ta, TaN, Mo, W, Ru, or combinations thereof.

At operation 670, the adhesion layer 616 is then deposited on at least a portion of the etch stop layer 615 and at least a portion of the substrate 605. The adhesion layer 616 can be deposited using a PVD process to a thickness of about 1 Å to about 100 Å, such as from about 1 Å to about 10 Å, such as from about 3 Å to about 5 Å. The PVD process of operation 670 to form the adhesion layer 616 can be the same as, or similar to, operation 570 of FIG. 5B. The adhesion layer can include any suitable material such as Ti, TiN, Ta, TaN, Mo, W, Ru, or combinations thereof. In at least one embodiment, the material used to form the adhesion layer 616 is different from the material used to form the etch stop layer 615. For example, when the adhesion layer 616 is a Ti layer, the etch stop layer 615 can be a Ru layer and/or a W layer. That is, the adhesion layer 616 is free of, or substantially free of, Ru and/or W, and the etch stop layer 615 is free of, or substantially free of, Ti.

The metal layer 620 is then deposited on the adhesion layer 616 at operation 675. The metal layer 620 can be deposited using a PVD process to a thickness of about 50 Å to about 500 Å, such as from about 100 Å to about 400 Å, such as from about 200 Å to about 300 Å. Deposition of the metal layer 620 of operation 675 can be the same as, or similar to, operation 330 of FIG. 3B. In some embodiments, the metal layer 620 includes any suitable material such as Ru, Mo, W, Cu, Co, Ir, metal silicides, metal alloys, or combinations thereof. In at least one embodiment, the material used to form the metal layer 620 is different from the material used to form the adhesion layer 616. For example, when the metal layer 620 is a W layer, the adhesion layer 616 can be a Ru layer. That is, the metal layer 620 is free of, or substantially free of, Ru, and the adhesion layer 616 is free of, or substantially free of, W.

The metal layer 620 produced from operation 675 can have a resistivity of about 40 $\mu\Omega$·cm or less, such as about 35 $\mu\Omega$·cm or less, such as about 30 $\mu\Omega$·cm or less, such as about 25 $\mu\Omega$·cm or less, such as about 20 $\mu\Omega$·cm or less, such as about 15 $\mu\Omega$·cm or less, such as about 10 $\mu\Omega$·cm or less, such as about 5 $\mu\Omega$·cm or less.

New and improved etch stop/liner materials, that can, e.g., actively lead to low-resistivity metal layers formed thereon, are described herein. Embodiments described herein also include processes that can change one or more properties of conventional etch stop/liner materials (e.g., TiN) such that metal layers formed thereon have low resistivity. Processes that enable selective deposition of etch stop liner materials such that the metal layers formed thereon have low resistivity are also described herein.

In the foregoing, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the foregoing aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

For the purposes of this disclosure, and unless otherwise specified, the terms "liner" and "etch stop" are used interchangeably. Thus, embodiments described herein related to liner materials also include etch stop materials, and vice-versa.

For purposes of this present disclosure, and unless otherwise specified, all numerical values within the detailed description and the claims herein are modified by "about" or "approximately" the indicated value, and consider experimental error and variations that would be expected by a person having ordinary skill in the art. For purposes of this present disclosure, and unless otherwise specified, all numerical values within the detailed description and the claims herein are modified by "about" or "approximately" the indicated value, and consider experimental error and variations that would be expected by a person having ordinary skill in the art. For the sake of brevity, only certain ranges are explicitly disclosed herein. However, ranges from any lower limit may be combined with any upper limit to recite a range not explicitly recited, as well as, ranges from any lower limit may be combined with any other lower limit to recite a range not explicitly recited, in the same way, ranges from any upper limit may be combined with any other upper limit to recite a range not explicitly recited. Additionally, within a range includes every point or individual value between its end points even though not explicitly recited. Thus, every point or individual value may serve as its own lower or upper limit combined with any other point or individual value or any other lower or upper limit, to recite a range not explicitly recited.

As used herein, the indefinite article "a" or "an" shall mean "at least one" unless specified to the contrary or the context clearly indicates otherwise.

While the foregoing is directed to embodiments of the present disclosure, other and further embodiments of the disclosure may be devised without departing from the basic scope thereof, and the scope thereof is determined by the claims that follow.

What is claimed is:

1. A process for fabricating a semiconductor structure, comprising:
performing a degas operation on the semiconductor structure;
depositing a liner layer on the semiconductor structure;
performing a sputter operation on the liner layer of the semiconductor structure while applying a bias to the semiconductor structure via an alternating current to at least partially amorphize the liner layer; and
depositing, by physical vapor deposition, a metal layer on the liner layer, wherein:
the liner layer comprises Ti, Ta, TaN, or combinations thereof, and
a resistivity of the metal layer is about 30 μΩ·cm or less.

2. The process of claim 1, wherein the degas operation, depositing the liner layer, the sputter operation, and depositing the metal layer are performed in a single cluster tool.

3. The process of claim 1, wherein a thickness of the liner layer is about 25 Å or less.

4. The process of claim 1, wherein the resistivity of the metal layer is about 20 μΩ·cm or less.

5. The process of claim 1, wherein:
a thickness of the liner layer is about 20 Å or less;
the resistivity of the metal layer is about 15 μΩ·cm or less; or
a combination thereof.

6. A process for fabricating a semiconductor structure, comprising:
performing a degas operation on the semiconductor structure;
depositing, by physical vapor deposition, an etch stop layer on the semiconductor structure after the degas operation;
depositing, by physical vapor deposition, a metal seed layer on the etch stop layer;
performing a sputter operation on the semiconductor structure while applying a bias to the semiconductor structure via an alternating current, the sputter operation being performed after depositing the metal seed layer to at least partially amorphize the metal seed layer; and
depositing, by physical vapor deposition, a metal layer on the semiconductor structure after performing the sputter operation.

7. The process of claim 6, wherein the degas operation, depositing the etch stop layer, depositing the metal seed layer, performing the sputter operation, and depositing the metal layer are performed in a single cluster tool.

8. The process of claim 6, wherein
performing the sputter operation on the semiconductor structure comprises performing the sputter operation on the metal seed layer.

9. The process of claim 8, wherein:
the sputter operation is performed for about 30 seconds or less;
the metal seed layer has a thickness of about 80 Å or less;
the metal layer has a thickness of about 100 Å or more; or
combinations thereof.

10. The process of claim 6, wherein the metal layer has a resistivity of about 40 μΩ·cm or less.

11. The process of claim 10, wherein the resistivity of the metal layer is about 30 μΩ·cm or less.

12. The process of claim 6, wherein:
the etch stop layer comprises Ti, TiN, Ta, TaN, Mo, W, Ru, or combinations thereof; and
the metal layer comprises Ru, Mo, W, Cu, Co, Ir, or combinations thereof.

13. The process of claim 10, wherein the metal layer comprises Ru, W, or both.

14. The process of claim 6, wherein the etch stop layer is deposited at a pressure of about 5 mTorr to about 20 mTorr.

15. The process of claim 6, wherein the etch stop layer comprises a thickness from about 5 Å to about 50 Å.

16. The process of claim 6, wherein the sputter operation comprises bombarding the etch stop layer with one or more suitable ions selected from the group consisting of He ions, Ne ions, Ar ions, Kr ions, and Xe ions.

17. The process of claim 6, wherein the sputter operation is performed for about 5 minutes or less.

18. The process of claim 6, wherein the alternating current substrate bias power is from about 0 W to about 500 W.

19. The process of claim 7, wherein one or more of the degas operation, depositing the etch stop layer, depositing the metal seed layer, performing the sputter operation, and depositing the metal layer are performed without a vacuum break.

20. The process of claim 6, wherein the metal seed layer comprises a thickness of about 5 Å to about 50 Å.

* * * * *